United States Patent
Kunitou

[11] Patent Number: 5,854,110
[45] Date of Patent: Dec. 29, 1998

[54] PROCESS FABRICATING SEMICONDUCTOR DEVICE HAVING TWO ION-IMPLANTATIONS CARRIED OUT BY USING A SHARED PHOTO-RESIST MASK

[75] Inventor: Masao Kunitou, Tokyo, Japan

[73] Assignee: NEC Corporation, Tokyo, Japan

[21] Appl. No.: 864,429

[22] Filed: May 28, 1997

[30] Foreign Application Priority Data

May 28, 1996 [JP] Japan .................................. 8-156050

[51] Int. Cl.⁶ .............................................. H01L 21/8234
[52] U.S. Cl. ........................................... 438/275; 438/276
[58] Field of Search ................................. 438/275, 276, 438/277, 278

[56] References Cited

U.S. PATENT DOCUMENTS

| | | | |
|---|---|---|---|
| 5,156,989 | 10/1992 | Williams et al. ........................ | 437/41 |
| 5,242,841 | 9/1993 | Smayling et al. ....................... | 437/29 |
| 5,449,637 | 9/1995 | Saito et al. ............................... | 437/57 |

*Primary Examiner*—Joni Chang
*Attorney, Agent, or Firm*—Foley & Lardner

[57] ABSTRACT

A semiconductor read only memory device has a p-type contact region nested in a p-type drain region of a p-channel type field effect transistor and formed through a first ion-implantation of boron through a first opening of a photo-resist mask and a first contact hole of an inter-level insulating layer under a first acceleration energy too small to penetrate the inter-level insulating layer and a channel region of a memory transistor formed in a p-type well and formed through a second ion-implantation of phosphorous through a second opening of the photo-resist mask and the inter-level insulating layer under a second acceleration energy too large to stop the phosphorous in the p-type drain region so that the photo-resist mask is shared between the two ion-implantations.

6 Claims, 4 Drawing Sheets

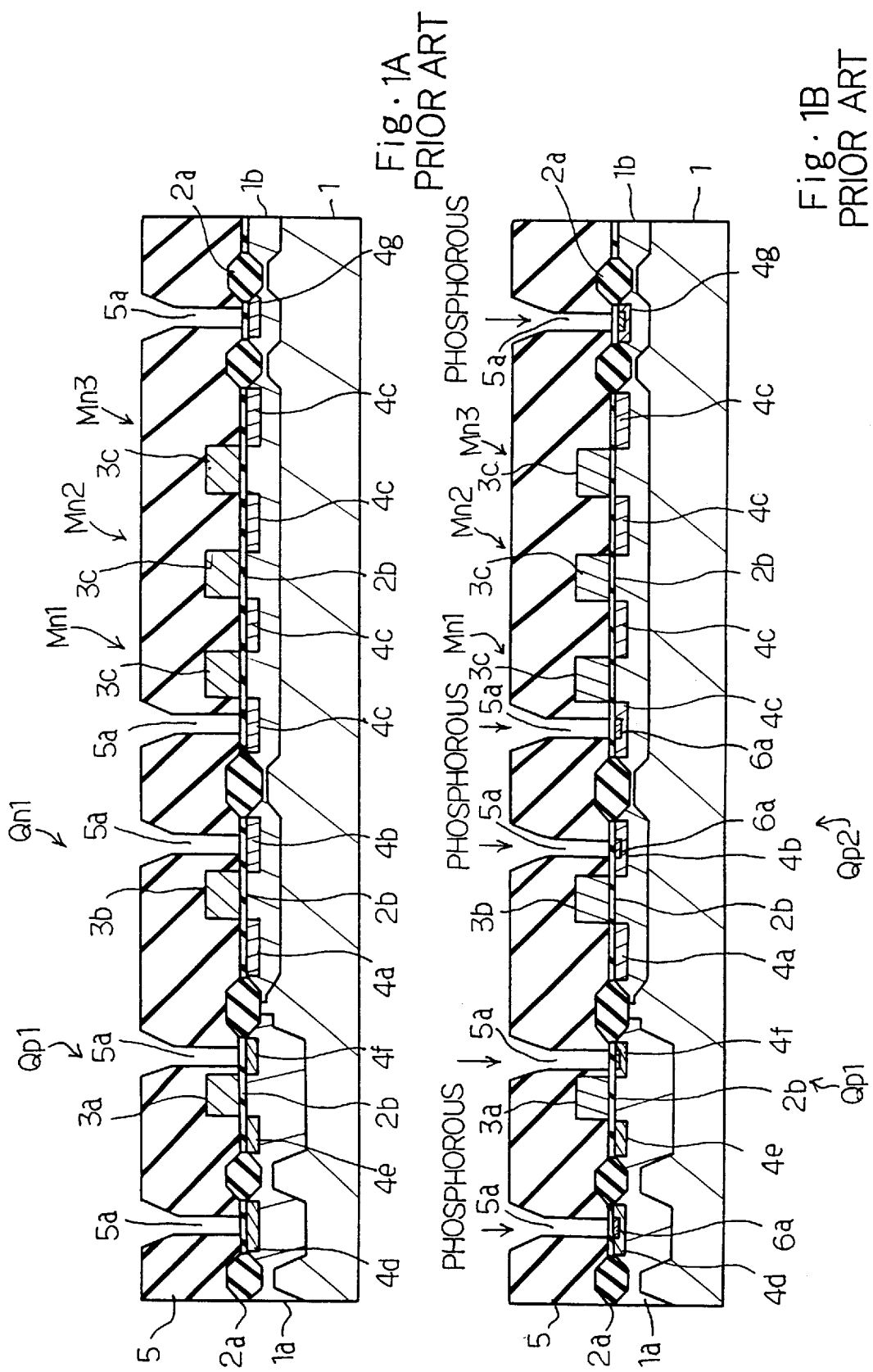

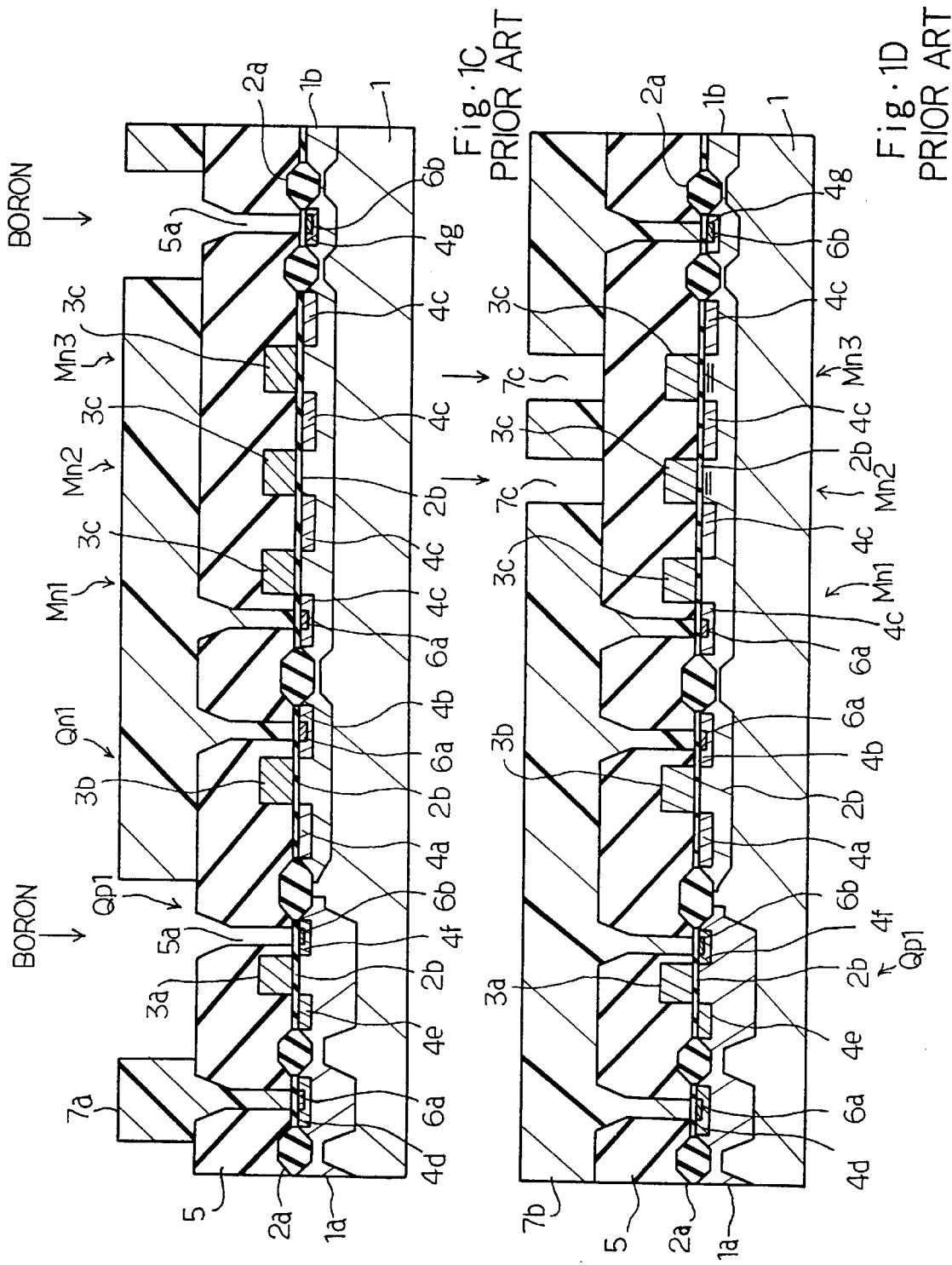

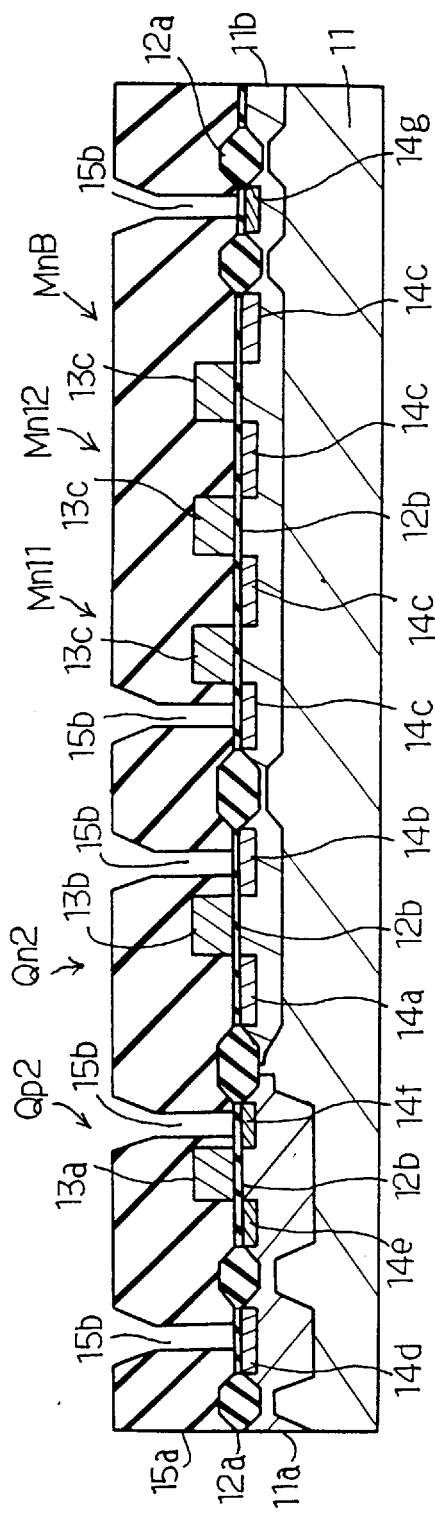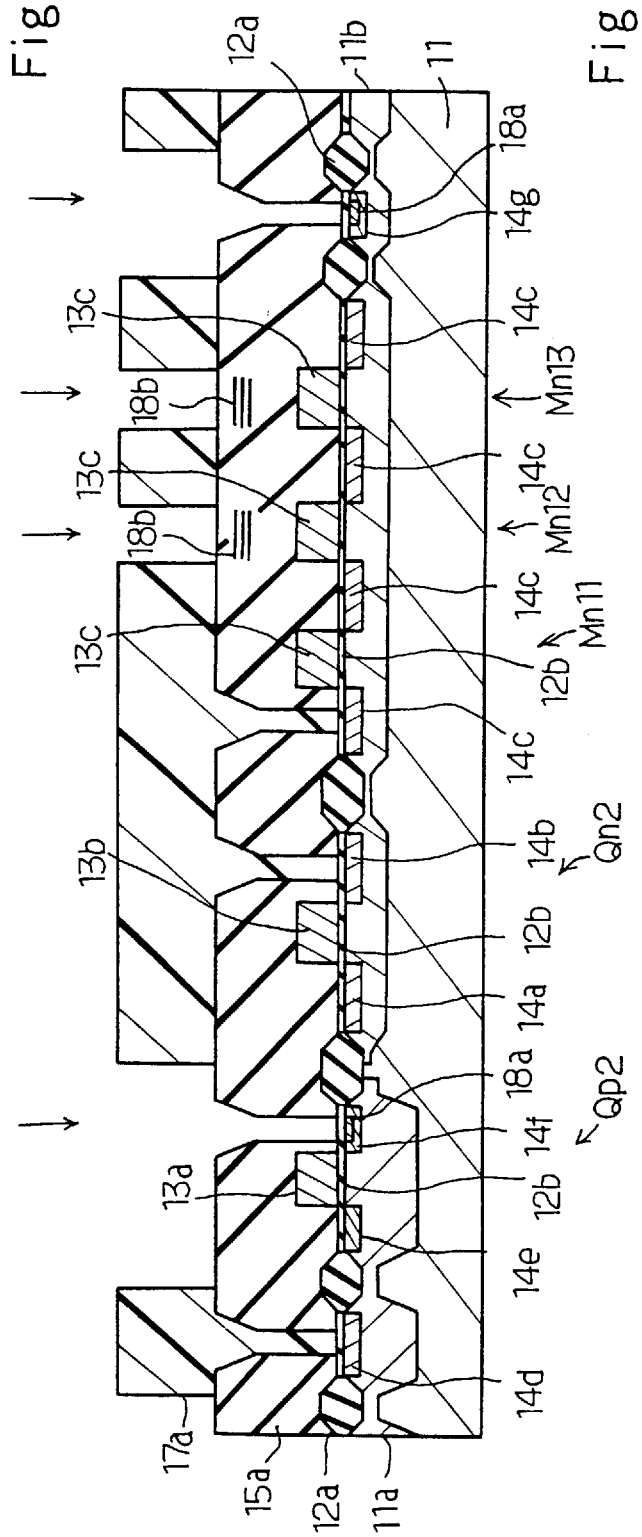
Fig. 2A
Fig. 2B

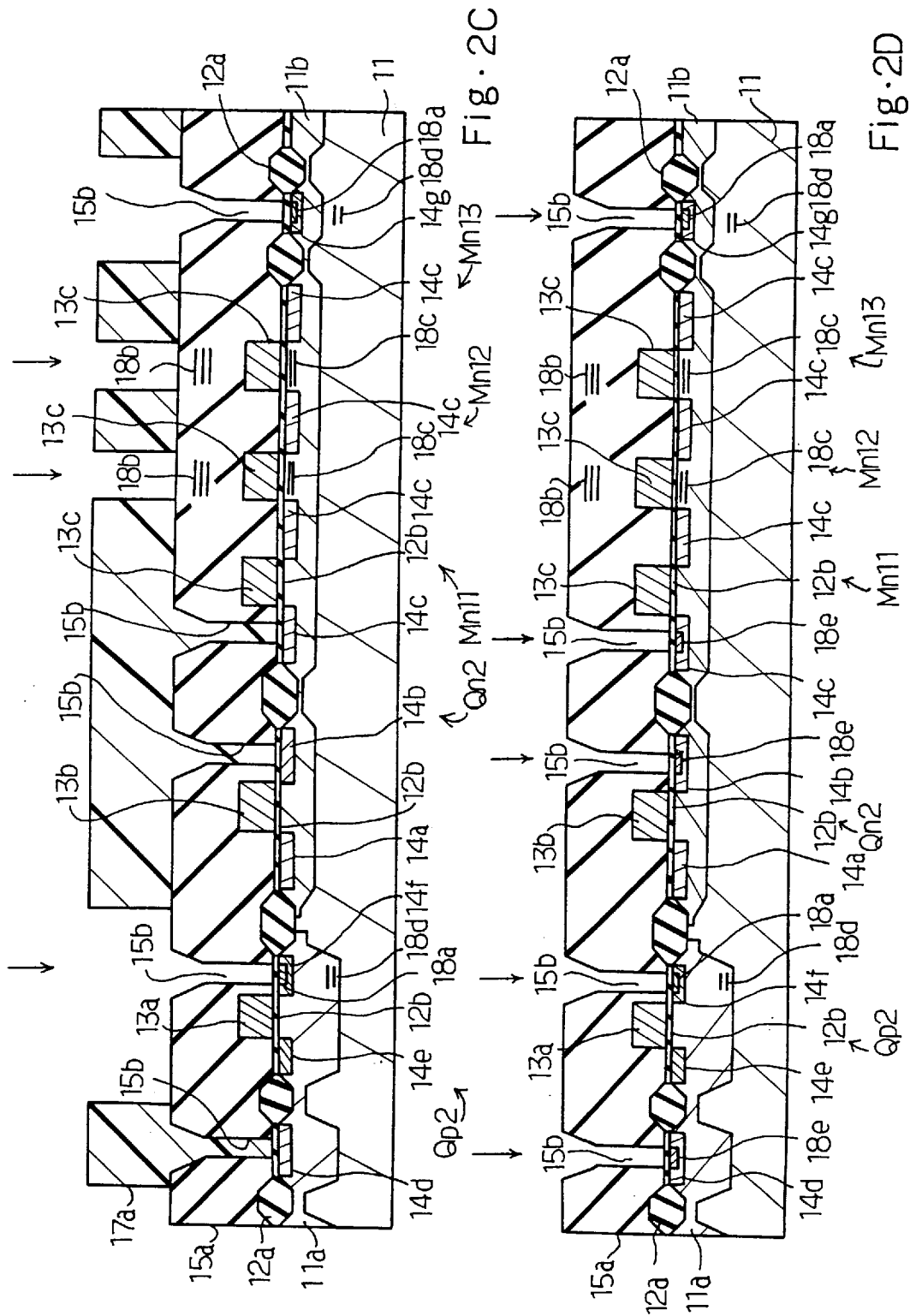

PROCESS FABRICATING SEMICONDUCTOR DEVICE HAVING TWO ION-IMPLANTATIONS CARRIED OUT BY USING A SHARED PHOTO-RESIST MASK

FIELD OF THE INVENTION

This invention relates to a process of fabricating a semiconductor device and, more particularly, to a process of fabricating a semiconductor read only memory device.

DESCRIPTION OF THE RELATED ART

FIGS. 1A to 1D illustrate the prior art process of fabricating a semiconductor read only memory device. The prior art process starts with preparation of a p-type silicon substrate 1, and a thick field oxide layer 2a is selectively grown on the major surface of the silicon substrate 1. The thick field oxide layer 2a divides the major surface of the p-type silicon substrate 1 into a plurality of active areas.

A photo-resist ion-implantation mask (not shown) is patterned on the major surface of the p-type silicon substrate 1, and center and right areas of the major surface is covered with the photo-resist ion-implantation mask. N-type dopant impurity such as phosphorous is ion implanted into the left area three times. The first ion-implantation, the second ion-implantation and the third ion-implantation are carried out at dose of $5.0 \times 10^{12}$ cm$^{-2}$ to $1.0 \times 10^{13}$ cm$^{-2}$ under acceleration energy of 700 KeV to 1000 KeV, at dose of $1.0-5.0 \times 10^{13}$ cm$^{-2}$ under acceleration energy of 300 KeV to 400 KeV and at dose of $1.0-5.0 \times 10^{12}$ cm$^{-2}$ under acceleration energy of 50 KeV to 100 KeV, and the phosphorous forms an n-type well 1a. A channel doping is regulated to an appropriate value for a p-channel type field effect transistor through the ion-implantation. After the ion-implantation, the photo-resist ion-implantation mask is stripped off.

A new photo-resist ion-implantation mask (not shown) is patterned on the major surface, and the left area is covered with the photo-resist ion-implantation mask. P-type dopant impurity such as boron is ion implanted into the center and right areas of the major surface twice. The first ion-implantation and the second ion-implantation are carried out at dose of $1.0-2.0 \times 10^{13}$ cm$^{-2}$ under acceleration energy of 150 KeV to 200 KeV and at dose of $1.0 \times 10^{12}$ cm$^{-2}$ to $1.0 \times 10^{13}$ cm$^{-2}$ under acceleration energy of 30 KeV to 50 KeV, and the boron forms a p-type well 1b. A channel doping is regulated to an appropriate value for an n-channel type field effect transistor and n-channel type memory transistors through the ion-implantation. After the ion-implantation, the photo-resist ion-implantation mask is stripped off.

Exposed areas of the n-type/p-type wells 1a/1b are thermally oxidized so as to grow a thin silicon oxide layer, and the thin silicon oxide layer partially serves as gate oxide layers 2b.

A multi-level conductive layer of the polyside structure is formed over the entire surface of the resultant semiconductor structure, and extends on the thick field oxide layer 2a and the thin gate oxide layers 2b. The multi-level conductive layer is 0.3 micron thick. A photo-resist etching mask (not shown) is patterned on the multi-level conductive layer, and the multi-level conductive layer is selectively etched away so as to form polyside gate electrodes 3a, 3b and 3c on the gate oxide layers 2b.

A photo-resist ion-implantation mask (not shown) is patterned on the resultant semiconductor structure, and the major surface is selectively covered with the photo-resist ion-implantation mask. N-type dopant impurity such as phosphorous is selectively ion implanted into the p-type well 1b and the n-type well 1a at dose of $2.0 \times 10^{15}$–$3.0 \times 10^{15}$ cm$^{-2}$ under acceleration energy of 70 KeV to 100 KeV in a self-aligned manner with the polyside gate electrodes 3b and 3c. N-type source and drain regions 4a/4b, n-type source/drain regions 4c and an n-type impurity region 4d are formed in the p-type well 1b and the n-type well 1a. After the ion-implantation, the photo-resist ion-implantation mask is stripped off.

A photo-resist ion-implantation mask (not shown) is patterned on the resultant structure, and the major surface is selectively covered with the photo-resist ion-implantation mask. P-type dopant impurity such as boron fluoride is selectively ion implanted into the n-type well 1a and the p-type well 1b in a self-aligned manner with the polyside gate electrode 3a at dose of $5.0 \times 10^{15}$ to $6.0 \times 10^{15}$ cm$^{-2}$ under acceleration energy of 70 KeV to 100 KeV, and forms p-type source and drain regions 4e and 4f and a p-type impurity region 4g in the n-type well 1a and the p-type well 1b. The resultant semiconductor structure is placed in nitrogen ambience at 900 degrees to 1000 degrees in centigrade for 30 minutes, and the ion-implanted dopant impurities are activated.

The gate oxide layer 2b, the polyside gate electrode 3a and the p-type source and drain regions 4e/4f form in combination a p-channel enhancement type field effect transistor Qp1, and the gate oxide layer 2b, the polyside gate electrode 3b and the n-type source and drain regions 4a/4b as a whole constitute an n-channel enhancement type field effect transistor Qn1. The gate oxide layer 2b, the polyside gate electrodes 3c and the n-type source/drain regions 4c form a series of n-channel type memory transistors Mn1, Mn2 and Mn3.

Insulating material is deposited to 0.40 micron to 0.50 micron over the entire surface of the resultant semiconductor structure by using a chemical vapor deposition, and forms an inter-level insulating layer 5. The inter-level insulating layer 5 is reflowed in nitrogen ambience at 900 degrees to 1000 degrees in centigrade for 30 minutes.

A photo-resist etching mask (not shown) is patterned on the inter-level insulating layer 5. The photo-resist etching mask selectively exposes the inter-level insulating layer 5 to hydrofluoric acid, and the inter-level insulating layer 5 is isotropically etched by 0.25 micron to 0.30 micron deep. Subsequently, using gaseous mixture $CHF_3$ and $O_2$ as gaseous etchant, the inter-level insulating layer 5 is further etched until contact holes 5a reaches the silicon oxide layer partially serving as the gate oxide layers 2b. The over-etching rate is about 200 percent. Thus, the contact holes 5a are formed over the n-type impurity region 4d, the p-type drain region 4f, the n-type drain region 4b, the n-type source/drain region 4c and the p-type impurity region 4g as shown in FIG. 1A. The photo-resist etching mask (not shown) is stripped off.

N-type dopant impurity such as phosphorous is ion implanted through the contact holes 5a into the n-type impurity region 4d, the p-type drain region 4f, the n-type drain region 4b, the n-type source/drain region 4c and the p-type impurity region 4g at dose of $3.0 \times 10^{14}$ cm$^{-2}$ to $5.0 \times 10^{14}$ cm$^{-2}$ under acceleration energy of 70 KeV to 100 KeV as shown in FIG. 1B. The phosphorous forms heavily doped n-type contact regions 6a in the n-type drain region 4b, the n-type source/drain region 4c and the n-type impurity region 4d.

Subsequently, a photo-resist ion-implantation mask 7a is patterned on the inter-level insulating layer 5, and the p-type drain region 4f and the p-type impurity region 4g are exposed to the openings of the photo-resist etching mask 7a. Boron is ion implanted into the p-type drain region 4f and the p-type impurity region 4g at dose of $3.0 \times 10^{15}$ to $5.0 \times 10^{15}$ cm$^{-2}$ under the acceleration energy of 30 KeV to 50 KeV, and heavily doped p-type contact regions 6b are formed in the p-type drain region 4f and the p-type impurity region 4g as shown in FIG. 1C. The photo-resist ion-implantation mask 7a is stripped off.

Subsequently, data bits are selectively stored in the memory transistors Mn1 to Mn3. A photo-resist ion-implantation mask 7b is patterned on the inter-level insulating layer 5, and has openings 7c over the polyside gate electrodes 3c of the memory transistors Mn2/Mn3. Phosphorous is ion implanted into the channel regions of the memory transistors Mn2/Mn3 at dose of $5.0 \times 1^{-13}$ to $7.0 \times 10^{13}$ cm$^{-2}$ under acceleration energy of 700 KeV to 1000 KeV. Then, the memory transistors Mn2 and Mn3 are changed to normally on-type, and the other memory transistor Mn1 remains in normally off-type. Thus, the data bits are selectively written into the memory transistors Mn1 to Mn3.

The prior art process encounters a problem in complexity. The n-type contact regions 6a, the p-type contact regions 6b and the data write-in need respective ion-implantations, and the lithography is repeated twice. As a result, the prior art process is made complex, and consumes long time period.

SUMMARY OF THE INVENTION

It is therefore an important object of the present invention to provide a simple process of fabricating a semiconductor device.

To accomplish the object, the present invention proposes to successively carry out formation of contact regions and a data write-in by using a single photo-mask.

In accordance with the present invention, there is provided a process of fabricating a semiconductor device, comprising the steps of: a) preparing a semiconductor substrate including a first impurity region of a first conductivity type formed in a first surface portion thereof, a second impurity region of a second conductivity type opposite to the first conductivity type formed in a second surface portion of thereof, a third impurity region of the second conductivity type formed in a third surface portion thereof and an insulating layer covering the first, second and third impurity regions and having first and second contact holes to which the first and second impurity regions are exposed, respectively; b) forming an ion-implantation mask on the insulating layer and having first and second openings over the second and third impurity regions, respectively; c) implanting a first dopant impurity through the first opening and the second contact hole into the second impurity region under a first acceleration energy too small to cause the first dopant impurity to reach the third impurity region so as to form a fourth impurity region of the second conductivity type nested in the second impurity region; d) implanting a second dopant impurity through the second opening and the insulating layer into the third impurity region under a second acceleration energy too large to cause the second dopant impurity to stop in the second impurity region so as to form a fifth impurity region of the first conductivity type nested in the third impurity region; e) removing the ion-implantation mask; and f) implanting a third dopant impurity through the first contact hole into the first impurity region at dose too small to change the fourth impurity region from the second conductivity type to the first conductivity type so as to form a sixth impurity region of the first conductivity type nested in the first impurity region.

BRIEF DESCRIPTION OF THE DRAWINGS

The features and advantages of the process according to the present invention will be more clearly understood from the following description taken in conjunction with the accompanying drawings in which:

FIGS. 1A to 1D are cross sectional views showing the prior art process of fabricating a semiconductor read only memory device; and FIGS. 2A to 2D are cross sectional views showing a process of fabricating a semiconductor read only memory device.

DESCRIPTION OF THE PREFERRED EMBODIMENT

FIGS. 2A to 2D illustrate a process of fabricating a semiconductor device embodying the present invention. The process according to the present invention starts with preparation of a p-type silicon substrate 11, and a thick field oxide layer 12a is selectively grown on the major surface of the silicon substrate 11. The thick field oxide layer 12a divides the major surface of the p-type silicon substrate 11 into a plurality of active areas.

A photo-resist ion-implantation mask (not shown) is patterned on the major surface of the p-type silicon substrate 11, and center and right areas of the major surface is covered with the photo-resist ion-implantation mask. N-type dopant impurity such as phosphorous is ion implanted into the left area three times. The first ion-implantation, the second ion-implantation and the third ion-implantation are carried out at dose of $5.0 \times 10^{12}$ cm$^{-2}$ to $1.0 \times 10^{13}$ cm$^{-2}$ under acceleration energy of 700 KeV to 1000 KeV, at dose of $1.0-5.0 \times 10^{13}$ cm$^{-2}$ under acceleration energy of 300 KeV to 400 KeV and at dose of $1.0-5.0 \times 10^{12}$ cm$^{-2}$ under acceleration energy of 50 KeV to 100 KeV, and the phosphorous forms an n-type well 11a. A channel doping level is regulated to an appropriate value for a p-channel type field effect transistor through the ion-implantation. After the ion-implantation, the photoresist ion-implantation mask is stripped off.

A new photo-resist ion-implantation mask (not shown) is patterned on the major surface, and the left area is covered with the photo-resist ion-implantation mask. P-type dopant impurity such as boron is ion implanted into the center and right areas of the major surface twice. The first ion-implantation and the second ion-implantation are carried out at dose of $1.0-2.0 \times 10^{13}$ cm$^{-2}$ under acceleration energy of 150 KeV to 200 KeV and at dose of $1.0 \times 10^1$ cm$^{-2}$ to $1.0 \times 10^{13}$ cm$^{-2}$ under acceleration energy of 30 KeV to 50 KeV, and the boron forms a p-type well 11b. A channel doping level is regulated to an appropriate value for an n-channel type field effect transistor and n-channel type memory transistors through the ion-implantation. After the ion-implantation, the photo-resist ion-implantation mask is stripped off.

Exposed areas of the n-type/p-type wells 11a/11b are thermally oxidized so as to grow a thin silicon oxide layer, and the thin silicon oxide layer partially serves as gate oxide layers 12b.

A multi-level conductive layer of the polyside structure is formed over the entire surface of the resultant semiconductor structure, and extends on the thick field oxide layer 12a and the thin gate oxide layers 12b. The multi-level conductive layer is 0.3 micron thick. A photo-resist etching mask (not shown) is patterned on the multi-level conductive layer, and the multi-level conductive layer is selectively etched away so as to form polyside gate electrodes 13a, 13b and 13c on the gate oxide layers 12b.

A photo-resist ion-implantation mask (not shown) is patterned on the resultant semiconductor structure, and the major surface is selectively covered with the photo-resist ion-implantation mask. N-type dopant impurity such as phosphorous is selectively ion implanted into the p-type well 11b and the n-type well 11a at dose of $2.0 \times 10^{15}$–$3.0 \times 10^{15}$ cm$^{-2}$ under acceleration energy of 70 KeV to 100 KeV in a self-aligned manner with the polyside gate electrodes 13b and 13c. N-type source and drain regions 14a/14b, n-type source/drain regions 14c and an n-type impurity region 14d are formed in the p-type well 11b and the n-type well 11a. After the ion-implantation, the photo-resist ion-implantation mask is stripped off.

A photo-resist ion-implantation mask (not shown) is patterned on the resultant structure, and the major surface is selectively covered with the photo-resist ion-implantation mask. P-type dopant impurity such as boron fluoride is selectively ion implanted into the n-type well 11a and the p-type well 11b in a self-aligned manner with the polyside gate electrode 13a at dose of $5.0 \times 10^{15}$ to $6.0 \times 10^{15}$ cm$^{-2}$ under acceleration energy of 70 KeV to 100 KeV, and forms p-type source and drain regions 14e and 14f and a p-type impurity region 14g in the n-type well 11a and the p-type well 11b. The resultant semiconductor structure is placed in nitrogen ambience at 900 degrees to 1000 degrees in centigrade for 30 minutes, and the ion-implanted dopant impurities are activated.

The gate oxide layer 12b, the polyside gate electrode 13a and the p-type source and drain regions 14e/14f form in combination a p-channel enhancement type field effect transistor Qp11, and the gate oxide layer 12b, the polyside gate electrode 13b and the n-type source and drain regions 14a/14b as a whole constitute an n-channel enhancement type field effect transistor Qn11. The gate oxide layer 12b, the polyside gate electrodes 13c and the n-type source/drain regions 14c form a series of n-channel type memory transistors Mn11, Mn12 and Mn13.

Insulating material is deposited to 0.40 micron to 0.50 micron over the entire surface of the resultant semiconductor structure by using a chemical vapor deposition, and forms an inter-level insulating layer 15a. The inter-level insulating layer 15a is reflowed in nitrogen ambience at 900 degrees to 1000 degrees in centigrade for 30 minutes.

A photo-resist etching mask (not shown) is patterned on the inter-level insulating layer 15a. The photo-resist etching mask selectively exposes the inter-level insulating layer 15a to hydrofluoric acid, and the inter-level insulating layer 15a is isotropically etched by 0.25 micron to 0.30 micron deep. Subsequently, using gaseous mixture CHF$_3$ and O$_2$ as gaseous etchant, the inter-level insulating layer 15a is further etched until contact holes 15b reaches the silicon oxide layer partially serving as the gate oxide layers 12b. The overetching rate is about 200 percent. Thus, the contact holes 15b are formed over the n-type impurity region 14d, the p-type drain region 14f, the n-type drain region 14b, the n-type source/drain region 14c and the p-type impurity region 14g as shown in FIG. 2A. The photo-resist etching mask (not shown) is stripped off.

A photo-resist ion-implantation mask (not shown) is patterned on the inter-level insulating layer 15a by using the lithographic techniques, and has openings over the p-type drain region 14f, the p-type impurity region 14g and the channel regions of the memory transistors Mn12 and Mn13 to be doped with p-type dopant impurity.

Using the photo-resist ion-implantation mask, p-type dopant impurity such as boron is ion implanted at dose of $3.0 \times 10^{15}$ to $5.0 \times 10^{15}$ cm$^{-2}$ under acceleration energy of 30 KeV to 50 KeV, and forms p-type contact regions 18a in the p-type drain region 14f and the p-type impurity region 14g. Although the boron penetrates into the inter-level insulating layer 15a over the memory transistors Mn12/Mn13, the projection range under the acceleration energy is of the order of 0.01 micron, and does not reach the channel regions of the memory transistors Mn12 and Mn13. Surface portions of the inter-level insulating layer 15a is merely doped with the boron 18b as shown in FIG. 2B.

Using the same photo-resist ion-implantation mask 17a, n-type dopant impurity such as phosphorous is ion implanted at dose of $5.0 \times 10^{13}$ to $7.0 \times 10^{13}$ cm$^{-2}$ under acceleration energy of 800 KeV to 1000 KeV. The acceleration energy is large enough to cause the phosphorous to reach the channel regions of the memory transistors Mn12/Mn13. The projection range at 800 KeV to 1000 KeV is 0.8 micron to 1.0 micron. As a result, the channel regions of the memory transistors Mn12/Mn13 are doped with the phosphorous 18c, and data bits are written into the memory transistors mn12/mn13 by changing the channel regions of the memory transistors Mn12/Mn13 to the n-type as shown in FIG. 2C. However, the photo-resist ion-implantation mask 17a prevents the memory transistor Mn11 from the phosphorous, and the data bits are selectively written into the memory transistors Mn11 to Mn13. The phosphorous 18d further penetrates through the p-type drain region 14f and the p-type well 11b into the n-type well 11a and the p-type silicon substrate 11. However, the phosphorous 18d merely changes the dopant concentration of the n-type well 11a and the p-type silicon substrate 11. The photo-resist ion-implantation mask 17a is stripped off.

Thus, the projection range is changed between the boron and the phosphorous, and the photo-resist mask 17a is shared between the ion-implantation for the data write-in and the ion-implantation for the p-type contact regions 18a. This makes the process sequence simple.

N-type dopant impurity such as phosphorous is ion implanted through the contact holes 15b at dose of $3.0 \times 10^{14}$ to $5.0 \times 10^{14}$ cm$^{-2}$ under acceleration energy of 30 KeV to 50 KeV, and forms n-type contact regions 18e in the n-type impurity region 14d, the n-type drain region 14b and the n-type source/drain region 14c as shown in FIG. 2D. Although the phosphorous is ion implanted into the p-type impurity region 14g and the p-type drain region 14f, the phosphorous is much smaller than the boron already implanted therein, and does not change the conductivity type of these regions 14g and 14f.

In this instance, the n-type impurity region/n-type drain region/n-type source/drain region 14d/14b/14c, the p-type drain region/p-type impurity region 14f/14g and the p-type well 11b serve as a first impurity region, a second impurity region and a third impurity region, respectively, and the p-type contact regions 18a, the n-type channel regions 18c and the n-type contact regions 18e serve as a fourth impurity region, a fifth impurity region and a sixth impurity region, respectively.

As will be appreciated from the foregoing description, the acceleration energy is changed between the ion-implantation for the p-type contact regions 18a and the ion-implantation for the data write-in, and, for this reason, the photo-resist ion-implantation mask 17a is shared between the two ion-implantations. Although two photo-resist ion-implantation masks 7a/7b are required for the prior art process, the process according to the present invention requires only one photo-resist ion-implantation mask 17a, and the process according to the present invention is simpler than the prior art process.

Although a particular embodiment of the present invention has been shown and described, it will be obvious to those skilled in the art that various changes and modifications may be made without departing from the spirit and scope of the present invention.

For example, the ion-implantation shown in FIG. 2D may be carried out between the formation of the contact holes 15b (see FIG. 2A) and the patterning step for the photo-resist ion-implantation mask 17a (see FIG. 2B).

Moreover, the ion-implantation for the p-type contact regions 18a may be carried out after the ion-implantation for the data write-in.

What is claimed is:

1. A process of fabricating a semiconductor device, comprising the steps of:
   a) preparing a semiconductor substrate including
      a first impurity region of a first conductivity type formed in a first surface portion thereof,
      a second impurity region of a second conductivity type opposite to said first conductivity type formed in a second surface portion of thereof,
      a third impurity region of said second conductivity type formed in a third surface portion thereof and
      an insulating layer covering said first, second and third impurity regions and having first and second contact holes to which said first and second impurity regions are exposed, respectively;
   b) forming an ion-implantation mask on said insulating layer and having first and second openings over said second and third impurity regions, respectively;
   c) implanting a first dopant impurity through said first opening and said second contact hole into said second impurity region under a first acceleration energy too small to cause said first dopant impurity to reach said third impurity region so as to form a fourth impurity region of said second conductivity type nested in said second impurity region;
   d) implanting a second dopant impurity through said second opening and said insulating layer into said third impurity region under a second acceleration energy too large to cause said second dopant impurity to stop in said second impurity region so as to form a fifth impurity region of said first conductivity type nested in said third impurity region;
   e) removing said ion-implantation mask; and
   f) implanting a third dopant impurity through said first contact hole into said first impurity region at dose too small to change said fourth impurity region from said second conductivity type to said first conductivity type so as to form a sixth impurity region of said first conductivity type nested in said first impurity region.

2. The process as set forth in claim 1, in which said step f) is carried out between said step a) and said step b).

3. The process as set forth in claim 1, in which said step d) is carried out before said step c).

4. The process as set forth in claim 1, in which said first impurity region is at least one of an n-type contact region of an n-type well, an n-type source and drain region for a first field effect transistor and an n-type source and drain region for a memory transistor, said second impurity region is at least one of a p-type source and drain region of a second field effect transistor and a p-type contact region of a p-type well, and said third impurity region is a p-type channel region of said memory transistor.

5. The process as set forth in claim 4, in which said memory transistor provides a read only memory cell storing a data bit in the form of channel conductivity type.

6. The process as set forth in claim 4, in which said first dopant impurity, said second dopant impurity and said third dopant impurity are boron, phosphorous and phosphorous, respectively.

* * * * *